United States Patent [19]

Cohen

[11] Patent Number: 4,755,745
[45] Date of Patent: Jul. 5, 1988

[54] INCOHERENT LIGHT OPTICAL PROCESSOR

[75] Inventor: Jonathan D. Cohen, Hanover, Md.

[73] Assignee: The United States of America as represented by the Director, National Security Agency, Fort George G. Meade, Md.

[21] Appl. No.: 845,673

[22] Filed: Mar. 4, 1986

[51] Int. Cl.[4] ............................................. G01R 23/16
[52] U.S. Cl. .................................... 324/77 K; 364/822
[58] Field of Search ............... 324/77 K, 96; 350/358, 350/359, 162.12; 364/822, 827, 837; 356/353

[56] References Cited

U.S. PATENT DOCUMENTS

| | | | |
|---|---|---|---|
| 3,988,671 | 10/1976 | Pedinoff | 324/77 K |
| 4,225,938 | 9/1980 | Turpin | 364/822 |
| 4,460,250 | 7/1984 | Freyre et al. | 350/358 |
| 4,556,950 | 12/1985 | Tai et al. | 350/162.2 |
| 4,637,724 | 1/1987 | Howell et al. | 356/353 |

OTHER PUBLICATIONS

Time Integ. Optical Signal Processing, P. Kellman, Optical Engineering, vol. 19, No. 3, May/Jun. 1980.
Programmable Acousto-Optic Filter, M. Gottlieb et al., SPIE, vol. 232, 1980, Internat. Optical Comp. Conf.
Integrated-Optic Spectrum Analyzer, M. K. Barnoski, IEEE Transac. on Circuits & Systems, vol. CAS-26, No. 12, Dec. '79.

*Primary Examiner*—Stewart J. Levy
*Assistant Examiner*—Louis M. Arana
*Attorney, Agent, or Firm*—John R. Utermohle; Thomas O. Maser

[57] ABSTRACT

An apparatus is described which performs acoustooptical signal processing functions with incoherent light, which procedures were formerly possible only with coherent light devices. Specific embodiments include an optical excisor, i.e., a programmable filter; a multichannel radiometer, i.e., an apparatus which estimates the power spectrum of a signal accompanied by noise; and an ambiguity processor, i.e., a time versus frequency cross correlator.

13 Claims, 4 Drawing Sheets

INCOHERENT LIGHT OPTICAL PROCESSOR

BACKGROUND OF THE INVENTION

1. Field of Invention

My invention relates to the field of optics, and more particularly to real time processing of optical signals with incoherent light.

2. Brief Description of the Prior Art

Real time optical signal processing technology began to develop at least as early as 1946, with processors capable of forming Hilbert transform pairs and limited voice processing. Processors using accoustooptic modulators date back to at least 1948, as illustrated by U.S. Pat. No. 2,451,465 to Barney. Since that time, interest in optical signal processing has steadily increased, despite the appearance and maturing of digital technology.

Though digital processors offer flexibility presently not possible in optics, interest continues to be drawn to optical solutions for a variety of reasons. The foremost of these is input bandwidth. While digital operation is difficult above bandwidths of a few tens of megahertz and nearly impossible above one hundred megahertz, acoustooptic processors routinely process bandwidths from the low megahertz region to a gigahertz. Optical signal processors operate exceptionally fast, with outputs available milliseconds to less than a microsecond after the input process is complete. The parallelism achieved in optics is also advantageous. It is not uncommon to perform operations on more than $10^5$ data elements, and with no more components than it takes to operate on a few. Still another feature of optics is that many desirable operations naturally lend themselves to easy implementation. The most important of these is the Fourier transform, which occurs in an almost trivial way in the optical domain. Multiplication is performed trivially, as well. Since optical systems usually have few components, they are often superior to their digital counterparts in size, power consumption, cost, and reliability.

Optical processors do not presently lend themselves to general problem solving by arbitrary programming. Instead, they are special purpose computers designed for specific tasks, capable of only very limited programming. As a result, a major portion of optical signal processing research is devoted to devising architectures to accomplish each desired operation. The operations performed by optical processors generally take the form of integral transforms in which the integrals are formed by one or both of two methods. Processors which accumulate the integral by collecting light over a period of time are termed "time-integrating processors." Optical architectures which achieve integration by virtue of the Fourier transform property of the lens are called "space integrating processors."

It was previously believed that most space-integrating processors—those which use the whole Fourier transform offered by a lens—required coherent light. The prototypical acoustooptic processors in this category are: the optical "excisor"—a programmable filter of electrical signals; the multichannel radiometer—a device to estimate the power spectrum of a signal accompanied by noise; and the ambiguity processor—a time versus frequency cross-correlator.

Techniques and devices are known in the prior art which allow these processors to be constructed, but only if coherent light is used as the illuminating source. This restriction is an undesirable limitation because, with incoherent light capability: light-emitting diodes can be used for sources; coherent "artifacts" are avoided; precisely controlled illumination is not required, in the sense that very poor collimation may be tolerated; and in some cases, the necessary optical system equipment may be simplified.

A fundamental problem with implementing an incoherent light optical processor lies in the difficulty in performing Fourier transforms with incoherent light. The possibility of performing this function has been predicted theoretically, and systems have been demonstrated which calculate the transform on a static signal such as a transparency. There is no known way to perform an equivalent function on a dynamic signal, nor is such a step straightforward, for real time processing and the use of real time modulators raise analytical questions not present in the static formulation. It would be desirable if incoherent light processors were available.

SUMMARY OF THE INVENTION

The optical processor comprising my invention may be used to implement a number of valuable functions, all of which are known in the prior art in coherent light embodiments. My contribution consists in embodiments which perform the same functions with incoherent light, with considerable attendant advantages in simplicity. In particular, my invention, as further explained hereinbelow, performs three particularly valuable processes, including (1) programmable optical filtering: (2) power spectrum estimation; and (3) time versus frequency cross-correlation. Each device to be described includes a number of common components, including an incoherent light source, an imaging lens, an acoustooptic modulator, a transform lens system, a shearing interferometer, and a detector. The manner in which these are arranged, the signals applied, and the detector characteristics determine the application and the result.

An apparatus having these and other desirable characteristics includes means for projecting a beam of incoherent light, a shearing interferometer positioned to receive said light beam, an electrical signal source, means for modulating the optical output of said interferometer with said electrical means, a detector, and means for projecting a Fourier transform of said modulated optical signal onto said detector.

BRIEF DESCRIPTION OF THE DRAWINGS

My invention may be best understood when the specification which follows is read in conjunction with the drawings, in which.

DESCRIPTION OF THE PREFERRED EMBODIMENTS

Figure 1:
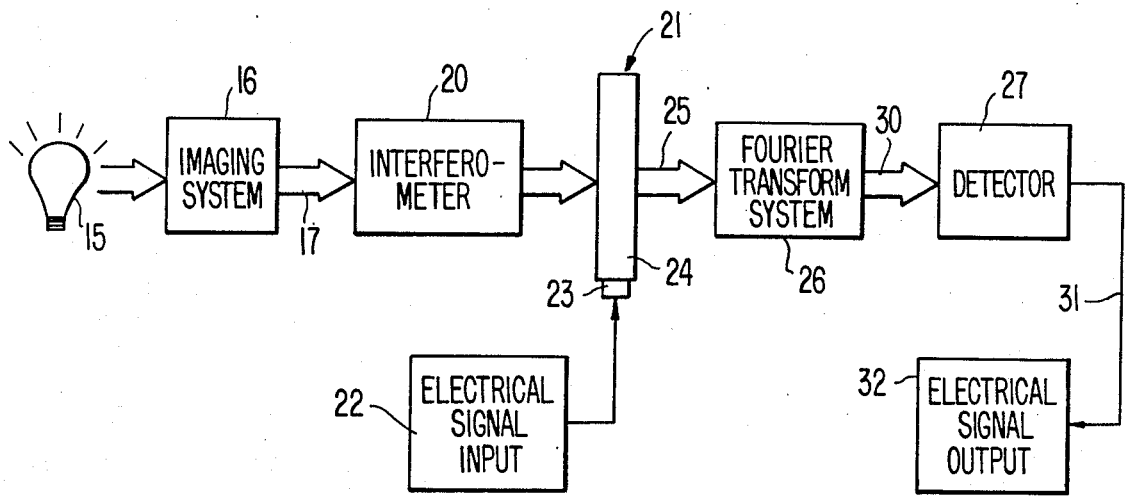
FIG. 1 is a generalized block diagram of my invention.

FIG. 1 illustrates my invention in its most general form. It includes a source of incoherent light 15 which illuminates an imaging lens system 16. The focused beam 17 is directed through a shearing interferometer 20 onto the face of an acoustooptical modulator 21 having an electrical input from source 22. The resulting modulated light beam 25 illuminates a transform lens system 26, and a detector 27 receives the transformed signal 30. Signals from the detector are passed over line 31 to output electronics 32 for subsequent use. The imaging system forms an image of the source in the plane of the acoustooptic modulator.

Each of the specific processing devices to be described, the excisor, the radiometer, and the ambiguity processor, shares the common configuration of FIG. 1. They differ only in the signals provided from electrical source 22, the configuration of the detector 27, and the output electronics 32. It is to be understood that the same detector configuration cannot be used in each application, so the specific device will differ from application to application.

Incoherent light source 15 is determined somewhat by the selection of the transform lens system 26. If the lens system is not truly achromatic, it will be necessary that light source 15 have a relatively narrow spectrum. The effect of having no chromatic correction is multiplicative smearing. The specific light used might be any which is spatially incoherent and provides relatively uniform illumination. Examples include a mercury vapor arc lamp, a light-emitting diode, or even a common incandescent lamp. Uniformity of illumination might be improved by appropriate focusing devices, and an interference bandpass filter could appropriately limit the illumination spectrum. An achromatic transform system may also be used.

Figure 2:
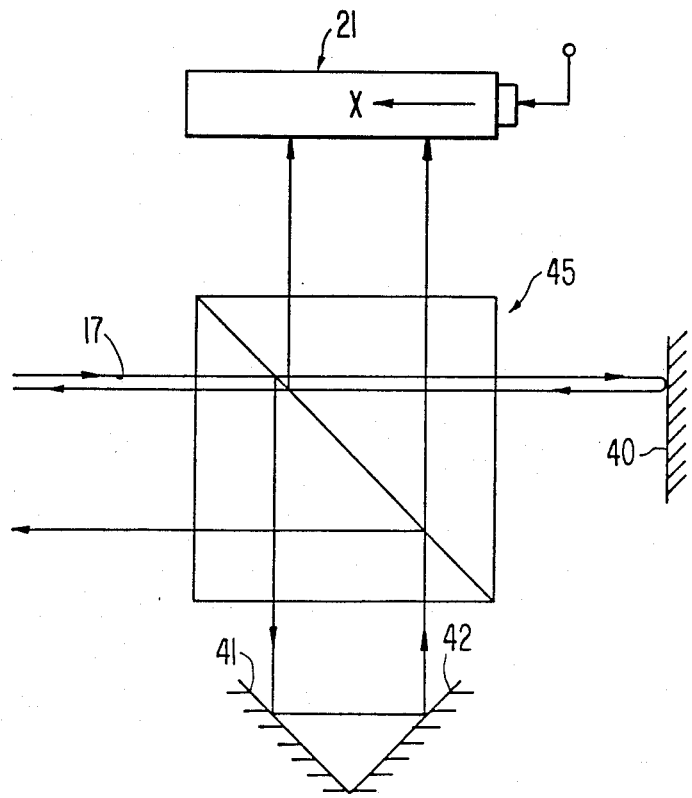
FIG. 2 illustrates an interferometer suitable for use in my invention.
Figure 3:
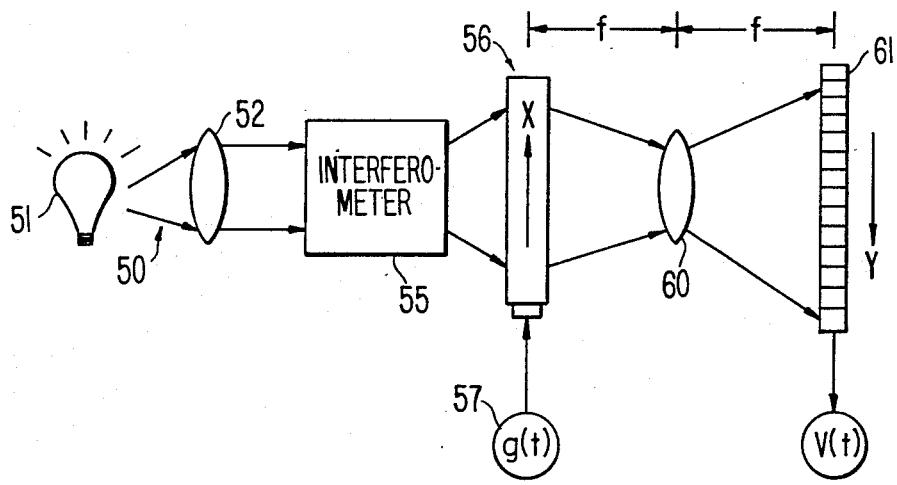
FIG. 3 illustrates an incoherent light excisor embodying the principles of my invention.

The shearing interferometer 20 of FIG. 1 is a particularly important and delicate component in the optical system. Its function is to superimpose two versions of the incoming wavefront, one reflected about a line and one not. While a device well-known in the literature as a Mertz interferometer will serve in this capacity, the preferred embodiment incorporates a Michelson interferometer, as illustrated in FIG. 2. It includes a first mirror 40 in one leg, and two mirrors 41 and 42 in the other. Alternatively, a prism employing two internal reflections could be substituted for mirrors 41 and 42. It is essential to match dispersion properties in the two legs of the interferometer; hence a nearly symmetrical beam splitter 45 is required. Either a cube or a pellicle will perform this function, but a cube is employed in this preferred embodiment.

The acoustooptic modulator or cell 21 of my invention is a well-known device consisting of a transparent (usually crystalline) material 24 to which is fixed a piezoelectric transducer 23. When the transducer is driven electrically by signals from source 22, acoustic waves are launched into the bulk of the modulator, where they propagate down the crystal at a velocity characteristic of the material. The acoustic wave consists of compressions and rarefactions of the material which produce modulation of the refractive index. Light passing through this disturbance is diffracted accordingly, thereby generating a modulated optical signal beam 25.

Transform system 26 in its most basic form is merely a lens, for a Fourier transform inherently results if an optical signal is imaged onto a lens placed one focal length away from the source of the signal. The transform is detected one focal length beyond the lens, which is the point at which the detector 27 is to be placed. Because the process performed by my invention requires only a 1-dimensional transform, the lens may be a cylindrical lens. If the source has a broad spectrum, and achromatic transform system may be employed.

A mathematical description of the general system of FIG. 1, necessary for understanding the specific processing devices, is given here. The description is in terms of the well-known mutual coherence function, limited to points on a line perpendicular to the optical propagation.

The incoherent light source may be characterized by the mutual coherence function $$\Gamma^s(x_1', x_2', t) = \delta(x_1' - x_2') \tag{1}$$

(up to a constant) where $x_1'$ and $x_2'$ identify positions on the source and t denotes time. After passing through the interferometer, the light which illuminates the acoustooptic cell has mutual coherence function $$\Gamma^a(x_1, x_2, t) = \tfrac{1}{2}[\delta(x_1 - x_2) + \delta(x_1 + x_2)]. \tag{2}$$

The acoustooptic cell causes the diffracted light to have mutual coherence proportional to $$\Gamma^{a'}(x_1, x_2, t) = \tfrac{1}{v} \Gamma^a(x_1, x_2, t) g(t - x_1/v) g^*(t - x_2/v) s(x_1/v) s(x_2/v), \tag{3}$$

where v is the acoustic propagation velocity in the acoustooptic cell, g(t) is the electrical input to the acoustooptic modulator, g*(t) is its complex conjugate, and s describes the aperture of the modulator. For simplicity of exposition, s is assumed symmetric.

The transform lens system produces the mutual coherence function $$\Gamma^b(y_1, y_2, t) = \int\int \Gamma^{a'}(x_1, x_2, t) e^{-j\frac{2\pi v}{fc}(x_1 y_1 - x_2 y_2)} dx_1 dx_2, \tag{4}$$

where v is the center frequency of the light source, f is the lens' focal length, and c is the speed of light.

As a result of the considerations above, the light intensity I seen in the detector plane is proportional to $$I(y, t) = \Gamma^b(y, y, t) = I_b(y, t) + I_s(y, t), \tag{5}$$

where $$I_b(y, t) = \tfrac{1}{2} \int |g(t - x)|^2 s^2(x) dx \tag{6}$$

is an (undesired) bias term, $$I_s(y, t) = \tfrac{1}{2} \int g(t - x) g^*(t + x) s^2(x) e^{-j2\pi x m y} dx \tag{7}$$

is the desired contribution, and $$m = \frac{2vv}{fc}. \tag{8}$$

As can be seen, the effect of using the incoherent source with the interferometer is to produce modulation due to both the signal propagating in the normal way and a virtual twin propagating in the reverse direction. It is this effect which is at the heart of the invention.

As previously stated, the configuration of detector 27 will vary with the application. It will be described more fully below.

EXCISOR

The optical excisor achieves a long-felt need for a single programmable device capable of filtering electronic signals in an arbitrary manner. With digital signal processing technology, such filters may be constructed with relatively little expense. Modification is readily achieved under either manual or computer control. Digital processing, however, becomes difficult and expensive for bandwidths above a few tens of megahertz and nearly impossible above approximately one hundred megahertz. Hence, those seeking filters of large bandwidth must turn to analog approaches.

Complex filters are difficult to construct using conventional electrical analog hardware. Such filters are programmable only in a very limited way and typically suffer from undesirable phase characteristics near transition regions. Achieving variability by selecting among an ensemble of fixed filters is prohibited by cost and size.

The optical excisor is an acoustooptic programmable transversal filter which overcomes the disadvantages cited above. It allows individual frequency contributions to be switched in and out independently. In this way, an extremely useful class of filters may be synthesized by simple programming.

An optical excisor embodying the principles of my invention may be constructed by choosing the acoustooptic cell input $$g(t) = G(t) + e^{j2\pi f_r t}, \tag{9}$$

where $G(t)$ is the signal to be filtered and $f_r$ is a reference frequency. It is assumed that $G$ has (positive) frequencies confined to the range $(f_L, f_H)$. With this input, the term of interest in the detector plane intensity is $$I_s(y,t) = Re \{e^{-j2\pi f_r t} \int G(t-x)s^2(x)e^{-j2\pi x(my+f_r)}dx\} + \text{other terms.} \tag{10}$$

Figure 4:
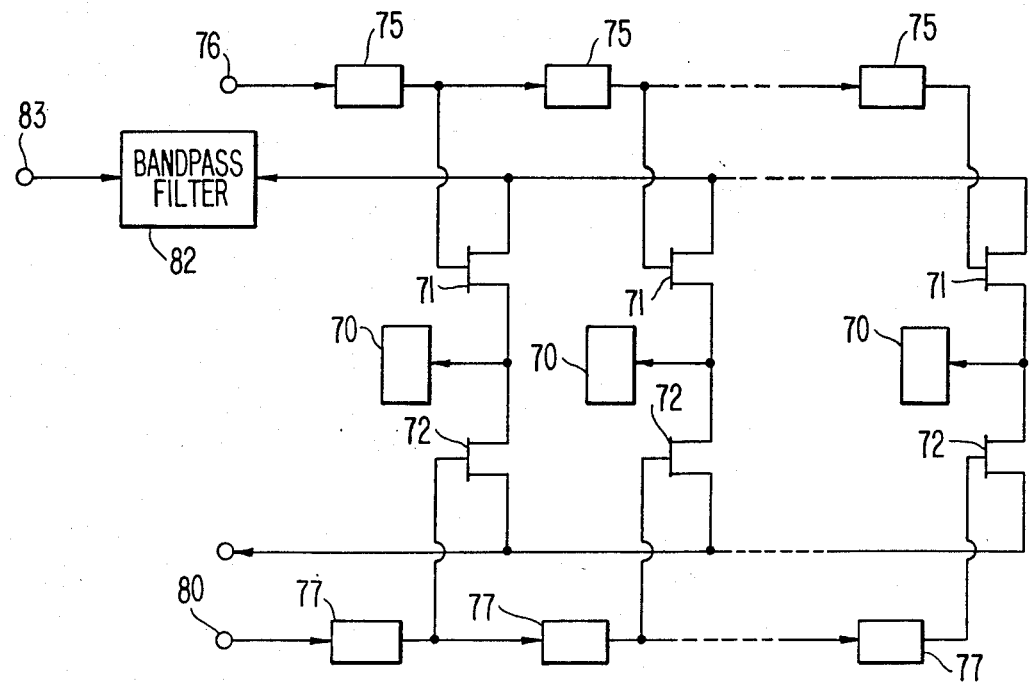
FIG. 4 illustrates an optical detector for use with the incoherent light optical excisor.

Thus, each position y in the output plane selects a band of frequencies centered at $my + f_r$ Hertz whose width is determined by the aperture s. These frequencies of G are seen shifted by $f_r$ Hertz. FIG. 4 illustrates a detector configuration suitable for use in this embodiment of my invention. It includes a plurality of photodiodes 70—70 the outputs of which are connected through a first plurality of field effect transistor (FET) switches 71—71 to a first output bus A and through a second plurality of FET switches 72—72 to a second output bus B. The switches are set by the contents of the stages 75—75 of a first shift register which receives data through terminal 76 and the stages 77—77 of a second shift register which receives data through terminal 80. At each instant, the detector provides a voltage v(t) proportional to the power of the light striking the enabled photodiodes.

The detector is programmed by clocking a stream of binary bits to input terminal 76 while simultaneously clocking in the complementary stream at input terminal 80. Once in place, these bits enable or disable FET switches 72—72 connected to the outputs of the shift register stages 77—77, according to whether a 1 or a 0 is present, respectively. Each photodiode 70 is connected to two complementarily driven switches. Depending upon the state of the corresponding register stages, the photoelectrons generated in the diode contribute to either of the two output buses A or B.

When placed in the transform plane, each diode is excited by light corresponding to a different frequency band of the input signal. By programming the detector, these contributions may be sent independently to either of the two buses. In particular, narrowband signals may be notched out by taking output bus A as the detector output, terminating bus B, and programming the detector to send frequency components corresponding to the interfering signals to the B bus. A more detailed understanding of the detector may be found in Borsuk, "Photodetectors for Acousto-optic Signal Processing," *Proc. I.E.E.E*, 69, No. 1, Jan. 1981, pp. 100–118.

The reference frequency $f_r$ is chosen so that $(f_L - f_r) > (f_H - f_L)$. In this way, the desired output term has no frequencies in common with the other terms produced. The bandpass filter 82 is used to block the undesired terms in the detector output, producing the correct exciser output 83.

RADIOMETER

The multichannel radiometer, also known as a time integrating channelized receiver, provides an estimate of the power spectrum of an unknown signal in noise. The prior art, typified by the block diagram of FIG. 5, contains devices capable of generating this effect. The noisy signal g(t) enters a bank of n bandpass filters 85—85, which pass adjacent bands of B hertz width each. At the output of each filter is a square law detector 86 followed by an integrator 87. As is readily apparent from straightforward analysis, the energy of each output $T_j$ is the sum of a signal contribution and a noise contribution. Further, because the signal to noise ratio increases with integration time, the integrated output is seen to represent the energy of the signal present within the pass band.

Figure 5:
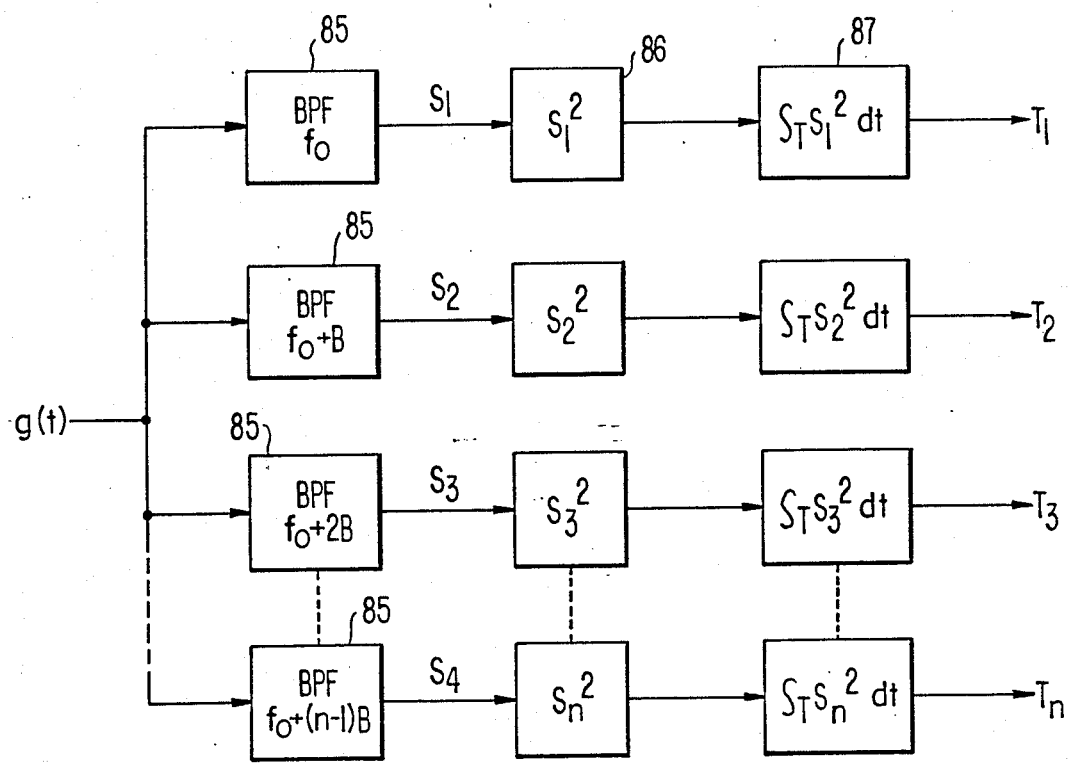
FIG. 5 is a generalized block diagram of a multichannel radiometer.

The apparatus of FIG. 5 may be duplicated without difficulty using coherent light and a substitution of optical elements for the model elements. This procedure will not work if incoherent light is used, however. In such a case the incoherent light transform results in an intensity distribution, rather than an amplitude distribution, which is proportional to the transform. Integration of this result would fail because, as the signal progressed in the acoustooptic cell, the sign of the transform contribution in each pixel would oscillate and prevent the integral from forming.

Figure 6:
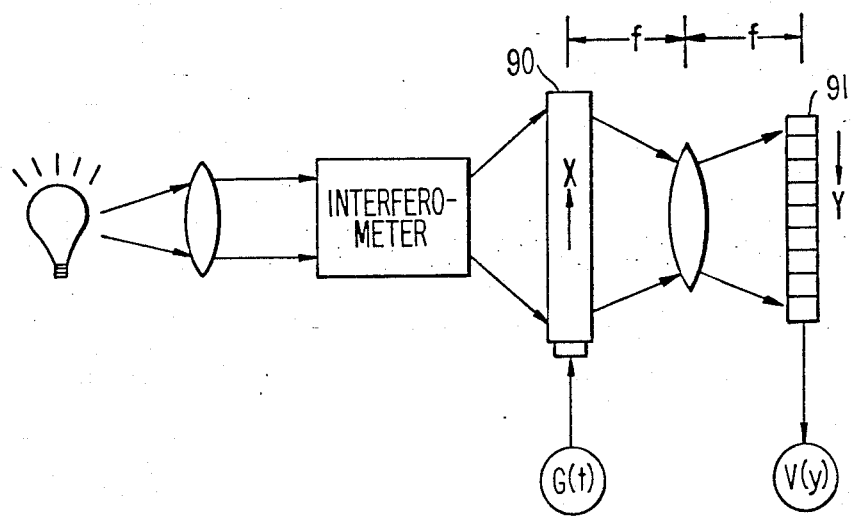
FIG. 6 illustrates an incoherent light multichannel radiometer embodying the principles of my invention.

The apparatus of FIG. 1 may be used to build a multichannel radiometer as illustrated in FIG. 6. The acoustooptic cell 90 is driven by $g(t) = G(t)$, the signal to be processed. In this embodiment, the detector 27 of FIG. 1 would be a one-dimensional time-integrating detector array 91, oriented as illustrated in FIG. 6, and placed in the transform plane. Such detectors are well known in the prior art.

A detector pixel located at position y integrates the intensity I(y,t) over an interval T to produce the output $$V(y) = \int_T I_s(y,t)dt + \text{bias term.} \tag{11}$$

If T is long enough, the output may be approximated by $$V(y) \simeq \frac{1}{2} \int_T |g^\sim(f)|^2 [s^2]^\sim (my + 2f) df + \text{bias term}, \quad (12)$$

where $\sim$ denotes Fourier transform. Thus, an estimate of the power spectrum of G, evaluated at $-my/2$ Hertz, is formed. The aperture function s determines, as usual, the resolution of the processor.

While more detailed analysis is not essential to an understanding of my invention, it may be readily determined that the output of detector array 91 provides an accurate estimate of the power spectrum. The reason that this architecture achieves the desired result with only one acoustooptic device is that it effectively created a product of two contrapropagating images of the input signal. Accumulation of such a product, at each position, provides a calculation of the autocorrelation evaluated at a lag proportional to position. The transform of the accumulated product produces an estimate of the power spectrum.

AMBIGUITY PROCESSOR

Calculation of the ambiguity function may serve a number of useful functions. As an example, consider a function whose analytic representation is $$\underline{g}(t) = \underline{n}(t) + \alpha e^{j\phi} \underline{h}(t - \tau_0) e^{j\omega_0 t}, \quad (13)$$

where $\alpha$ is some unknown positive real constant, $\phi$ is a phase which will be assumed to be known, n(t) is stationary white Gaussian noise of mean zero, h(t) is a known function, and $\tau_0$ and $\omega_0$ are unknown time and frequency shifts. The pair $(\tau_0, \omega_0)$ may be drawn from a known parameter space $\Omega$ which is often the direct sum of two intervals. The parameters $\tau_0$ and $\omega_0$ may correspond to range and velocity of a radar target, respectively. The goal is to estimate $\tau_0$ and $\omega_0$.

The maximum likelihood estimate $(\tau^*, \omega^*)$ of $(\tau_0, \omega_0)$ may be found by evaluating $$C(\tau, \omega) = Re\{e^{-j\phi} A^{g,h}(\tau, \omega)\}, \quad (14)$$

where $$A^{g,h}(\tau, \omega) = \int_{-\infty}^{\infty} g(t) h^*(t - \tau) e^{-j\omega t} dt \quad (15)$$

for each $(\tau, \omega) \in \Omega$. The maximum likelihood estimate of $(\tau_0, \omega_0)$ is that choice of $(\tau, \omega) \in \Omega$ which maximizes $C(\tau_0, \omega_0)$. The function $A^{g,h}$ defined in equation (15) is called the crossambiguity function of g and h.

If the value of $\phi$ is also unknown and may vary over all phases, then the maximum likelihood estimate of $(\tau_0, \omega_0)$ maximizes $|A^{g,h}|$.

If the space $\Omega$ is specified and the functions of time g and h are known, it is desired to have a device which will evaluate either the crossambiguity function of g and h or its magnitude over $\Omega$. Such a device is termed an "ambiguity function processor", or simply an "ambiguity processor."

Coherent light ambiguity processors are known in the prior art, as represented by U.S. Pat. No. 4,440,472. My present incoherent light implementation is superior to the coherent-light processor in both construction simplicity and lens aberration requirements.

Figure 7:
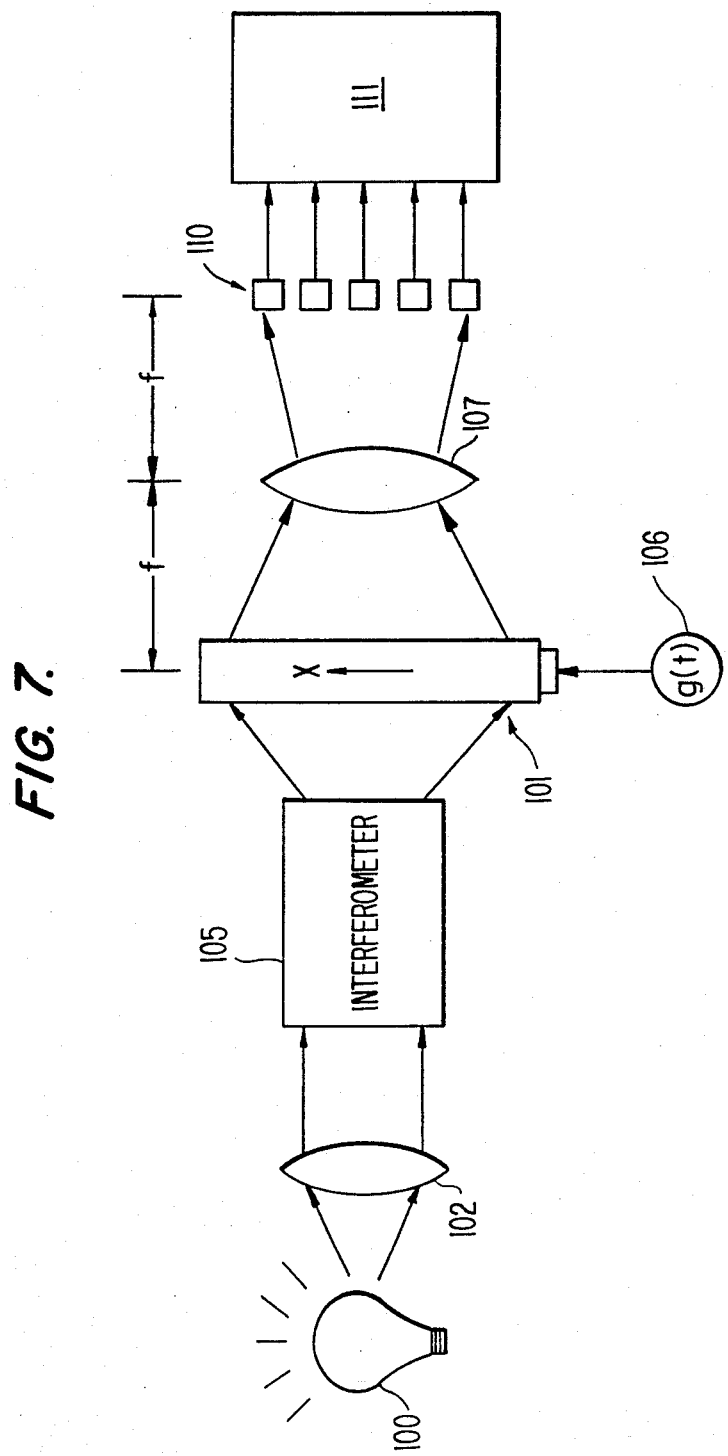
FIG. 7 illustrates an incoherent light ambiguity processor embodying the principles of my invention.

FIG. 7 illustrates an incoherent light ambiguity processor embodying the concepts of my invention. Like the previously described embodiments, it includes an incoherent light source 100 which illuminates an acoustooptic modulator 101 through an imaging lens 102 and a shearing interferometer 105. The signal g(t) to be analyzed is applied to modulator 101 from a signal source 106. A transform lens 107, located one focal length beyond the modulator, applies a transform of the output from the modulator to an array of fast diodes 110. Signals from the diodes are routed to a utilization device 111 for subsequent use.

Two signals G(t) and H(t) are processed by forming the acoustooptic drive signal $$g(t) = G(t) + H^r(t) e^{j2\pi f_r t}, \quad (16)$$

where $f_r$ is a reference frequency and where $H^r$ denotes the time-reverse of H. The signals G and H are assumed to be confined to the frequency range $(f_L, f_H)$. With this input, the transform plane intensity is $$I(y,t) = Re\{e^{-j2\pi f_r t} \int s^2(x) G(x+t) H^*(x-t) e^{j2\pi x(my+f_r)} dx\} + \text{other terms}, \quad (17)$$

which is seen to be an estimate of the crossambiguity function of G and H based on the observation window determined by s, evaluated at $$\tau = 2t, \quad \omega = 2\pi(my + f_r), \quad (18)$$

and on a carrier of frequency $f_r$. Thus, a fast detector placed at position y will see the ambiguity function at $$\omega = 2\pi(my + f_r) \quad (19)$$

evolve in time. The processor is completed, then, by placing an array of fast detectors in the transform plane, whose outputs pass through electrical band pass filters. The frequency $f_r$ is chosen such that $f_r > 2(f_H - f_L)$. In this case the band pass filters, passing the frequencies $(f_r + f_H - f_L, f_r + f_H - f_L)$ will block the undesired terms.

The above-identified embodiments illustrate various ways in which incoherent light optical processors may be implemented. There are many additional processors which may be implemented using the techniques and apparatus which I have described, and I intend that my invention encompass all such processors included within the limits of the claims set forth below.

I claim:
1. An optical processor, comprising:
   means for projecting a beam of incoherent light;
   a shearing interferometer positioned to receive said light beam;
   an electrical signal source;
   means for modulating the optical output of said interferometer with said electrical signal;
   a detector; and
   means for projecting a Fourier transform of said modulated optical signal onto said detector.
2. The processor of claim 1, wherein said modulating means is an acoustooptic modulator.
3. The processor of claim 1, wherein said means for projecting a Fourier transform is an achromatic lens system.
4. The processor of claim 1, wherein said means for projecting a beam of incoherent light includes a source of incoherent light and an imaging lens system illuminated by said light.

5. An acoustooptic programmable transversal filter, comprising:
   means for projecting a beam of incoherent light;
   a shearing interferometer positioned to receive said light beam;
   means for providing an electrical signal to be filtered;
   means for modulating the optical output signal of said interferometer with said electrical signal;
   means for detecting an optical signal, said detecting means comprising means for measuring the light intensity incident on selected portions of said detecting means, and
   means for projecting a Fourier transform of said modulated optical output signal onto said detecting means.

6. The apparatus of claim 5 wherein said detecting means further comprises means for selectively enabling and disabling selected portions of said detecting means.

7. The apparatus of claim 6 wherein said detecting means further comprises programmable means for enabling selected portions of said detecting means.

8. The apparatus of claim 7 wherein said detecting means further comprises:
   an electrical output, a plurality of electrooptic detector elements which provide an electrical output in response to an optical input, and programmable switching means connected thereto for providing selected outputs of said elements to said electrical output.

9. The apparatus of claim 5 wherein the means for providing an electrical signal comprises means for providing an electrical signal of the form $$g(t) = G(t) + e^{j2\pi f_r t}$$

where G(t) is a signal to be filtered and $f_r$ is a predetermined reference frequency.

10. The apparatus of claim 7 wherein said detecting means further comprises means for providing a voltage v(t) proportional to the total power of the optical signal incident on said selected portions of said detecting means.

11. An apparatus for computing an estimate of the power spectrum of an unknown electrical signal, comprising:
   means for projecting a beam of incoherent light;
   a shearing interferometer positioned to receive said light beam;
   means for providing an electrical signal to be measured;
   means for modulating the optical output of said interferometer with said electrical signal;
   a one-dimensional time integrating detector array positioned in the transform plane of said modulating means; and
   means for projecting a Fourier transform of said modulated optical signal onto said detector, whereby the output of said detector array is a close approximation of the power spectrum.

12. The apparatus of claim 11 wherein said detector array further comprises means for time-integrating the intensity of said modulated signal.

13. An acoustooptic ambiguity processor, comprising:
   means for projecting a beam of incoherent light;
   a shearing interferometer positioned to receive said light beam;
   means for providing an electrical signal $$g(t) = G(t) + H^r(t)e^{j2\pi f_r t}$$

where $f_r$ is a reference frequency and where $H^r$ denotes the time-reverse of H;
   means for modulating the optical output of said interferometer with said electrical signal;
   detector means comprising an array of fast detector elements which provide an electrical output in response to an optical input, and a bandpass filter on each electrical output selected to pass only predetermined frequencies between $f_r + f_L - f_H$ and $f_r + f_H - f_L$ where $f_r > 2(f_H - f_L)$ and inputs G and H are contained in $(f_L, f_H)$; and
   means for projecting a Fourier transform of said optical signal onto said detector.

* * * * *